United States Patent
Lee

(12) United States Patent  (10) Patent No.: US 7,515,412 B2
Lee  (45) Date of Patent: Apr. 7, 2009

(54) COOLING STRUCTURE FOR POWER SUPPLY

(75) Inventor: Jia-Shiunn Lee, Taoyuan (TW)

(73) Assignee: Enermax Technology Corporation, Taoyuan (TW)

( * ) Notice: Subject to any disclaimer, the term of this patent is extended or adjusted under 35 U.S.C. 154(b) by 47 days.

(21) Appl. No.: 11/790,509

(22) Filed: Apr. 26, 2007

(65) Prior Publication Data

US 2008/0266793 A1  Oct. 30, 2008

(51) Int. Cl.
*H05K 7/20* (2006.01)

(52) U.S. Cl. ................... 361/695; 361/694; 361/703; 361/719

(58) Field of Classification Search ............... None
See application file for complete search history.

(56) References Cited

U.S. PATENT DOCUMENTS

| | | | | |
|---|---|---|---|---|
| 3,566,959 A | * | 3/1971 | Koltuniak et al. ......... | 165/80.3 |
| 6,411,514 B1 | * | 6/2002 | Hussaini ..................... | 361/704 |
| 6,735,078 B2 | * | 5/2004 | Tsai .......................... | 361/695 |
| 7,215,542 B2 | * | 5/2007 | Chen et al. ................. | 361/694 |
| 2002/0006027 A1 | * | 1/2002 | Rodriguez et al. ......... | 361/688 |
| 2004/0027803 A1 | * | 2/2004 | Tsai .......................... | 361/695 |
| 2005/0030711 A1 | * | 2/2005 | Tsai .......................... | 361/687 |
| 2007/0081306 A1 | * | 4/2007 | Wong ........................ | 361/695 |

* cited by examiner

*Primary Examiner*—Gregory D Thompson
(74) *Attorney, Agent, or Firm*—Rosenberg, Klein & Lee

(57) ABSTRACT

A cooling structure for a power supply is disclosed. The power supply has a housing. The cooling structure includes a cooling fan and a cooler. The cooling fan is located on the inner side of the top surface of the housing. The cooler is located below the cooling fan. The cooler includes a vertical board and a plurality of cooling fins. The cooling fins are disposed slantwise on the vertical board and at intervals. There is a plurality of air-guiding channels between the cooling fins. Thereby, the airflow of the cooling fan can be guided forward to a specified direction. The hot air circulating flow will not occur. The cooling fan blows onto the electronic elements on the circuit board to exhaust the heat generated by the electronic elements, and noise generated from the cooling fans is lowered.

7 Claims, 7 Drawing Sheets

COOLING STRUCTURE FOR POWER SUPPLY

BACKGROUND OF THE INVENTION

1. Field of the Invention

The present invention relates to a cooling structure for a power supply. In particular, this invention relates to a cooling structure that includes a plurality of cooling fins disposed slantwise. There is also an air-guiding channel between the cooling fins.

2. Description of the Related Art

In order to provide the required power for a computer, a power supply is usually installed in the computer. A cooling fan is located on the top of the housing of the power supply, and there is a circuit board located in the housing of the power supply. The circuit board is located below the cooling fan and is disposed with a plurality of chips. On the circuit board, there is a cooler. As shown in FIG. 1, the cooler 1a includes a main board 10a, and two branching legs 20a. On a top surface of the main board 10a, there is a plurality of cooling fins 11a that are vertical and disposed at intervals. The two branching legs 20a extend downwards to form a plugging portion 21a so that the two branching legs 20a are plugged into and fastened onto the circuit board (not shown in the figure). The cooler 1a absorbs heat from the electronic elements of the circuit board and heat is exhausted to the outside of the housing by using the cooling fan of the power supply to guide air into cooler 1a. The problem of the power supply being damaged due to its temperature being too high is thereby avoided.

However, a hot air circulating flow easily occurs in the rear portion of the housing (that is close to the computer host). Therefore, the hot air cannot be exhausted outside of the housing. Heat therefore accumulates, and the temperature inside the housing rises. Because the cooling fins are disposed vertically, the resisting force is large when the cooing fan blows onto the cooling fins 11a, and the air cannot blow to the electronic elements on the circuit board. Moreover, when the load of the power supply is high, the rotation speed of the cooling fan has to be increased to exhaust more heat outside of the housing. The cooling fan is noisy.

SUMMARY OF THE INVENTION

One particular aspect of the present invention is to provide a cooling structure for a power supply. The cooling structure includes a plurality of cooling fins disposed slantwise, and there is an air-guiding channel between the cooling fins to guide the airflow of the cooling fan in a specified direction. Thereby, the hot air circulating flow will not occur and heat is easily exhausted. The cooling fan can blow more air onto the electronic elements on the circuit board. The cooling fan does not need to operate at a high speed so noise is thereby reduced.

The present invention provides a cooling structure for a power supply. The power supply has a housing. The cooling structure includes a cooling fan located on the inner side of the top surface of the housing, and a cooler that is located in the interior of the housing and located below the cooling fan. The cooler includes a vertical board and a plurality of cooling fins. The cooling fins are disposed slantwise on the vertical board and at intervals. There is a plurality of air-guiding channels between the cooling fins.

The present invention has the following characteristics. The airflow of the cooling fan can be guided in a specified direction to lower the resisting force. The hot air circulating flow will not occur. The cooling fan blows cool air onto the electronic elements on the circuit board to exhaust the heat generated by the electronic elements. The output power of the power supply increases, and the cooling fan can be operated at a low speed. It is quieter.

For further understanding of the invention, reference is made to the following detailed description illustrating the embodiments and examples of the invention. The description is only for illustrating the invention and is not intended to be considered limiting of the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Figure 1:
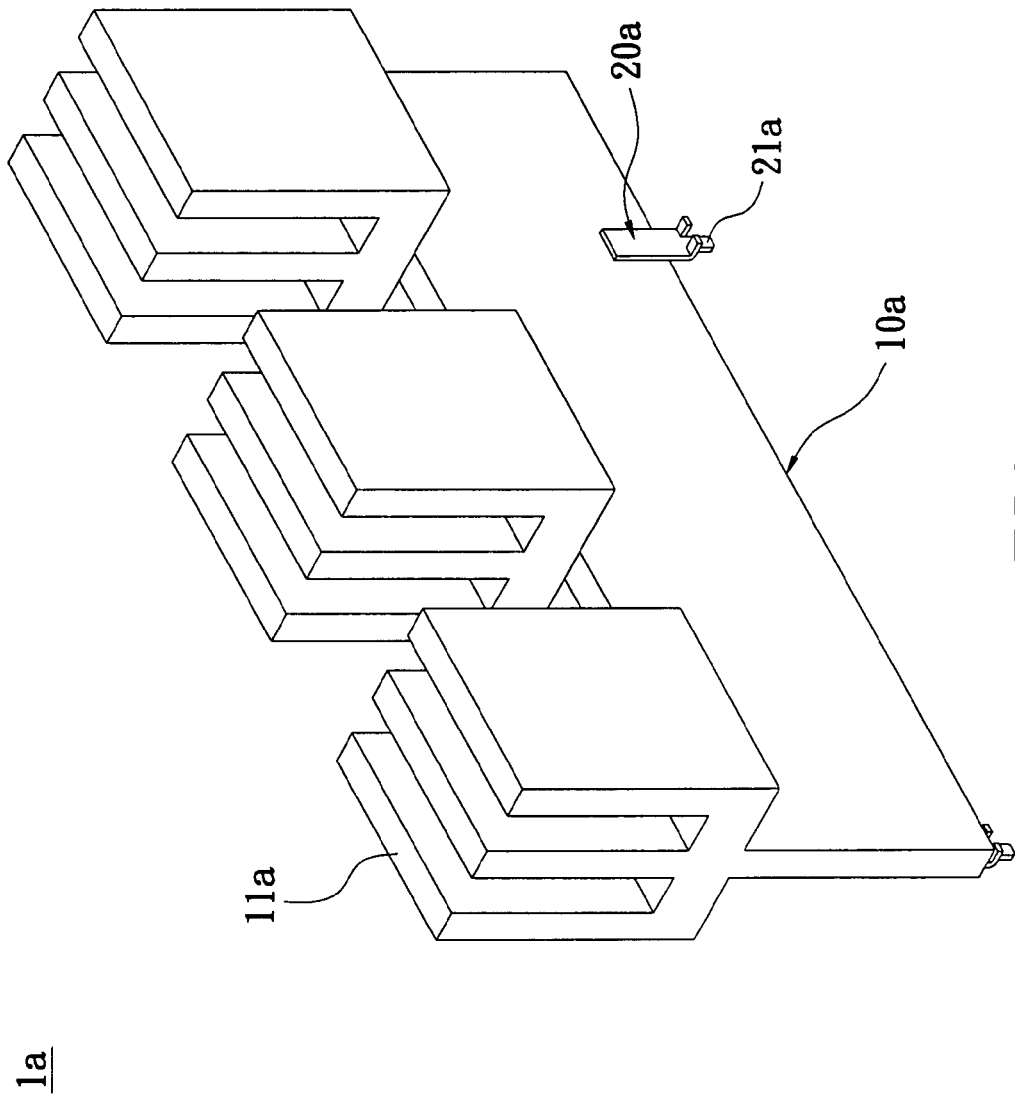
FIG. 1 is a perspective view of the cooler of the prior art.
Figure 2:
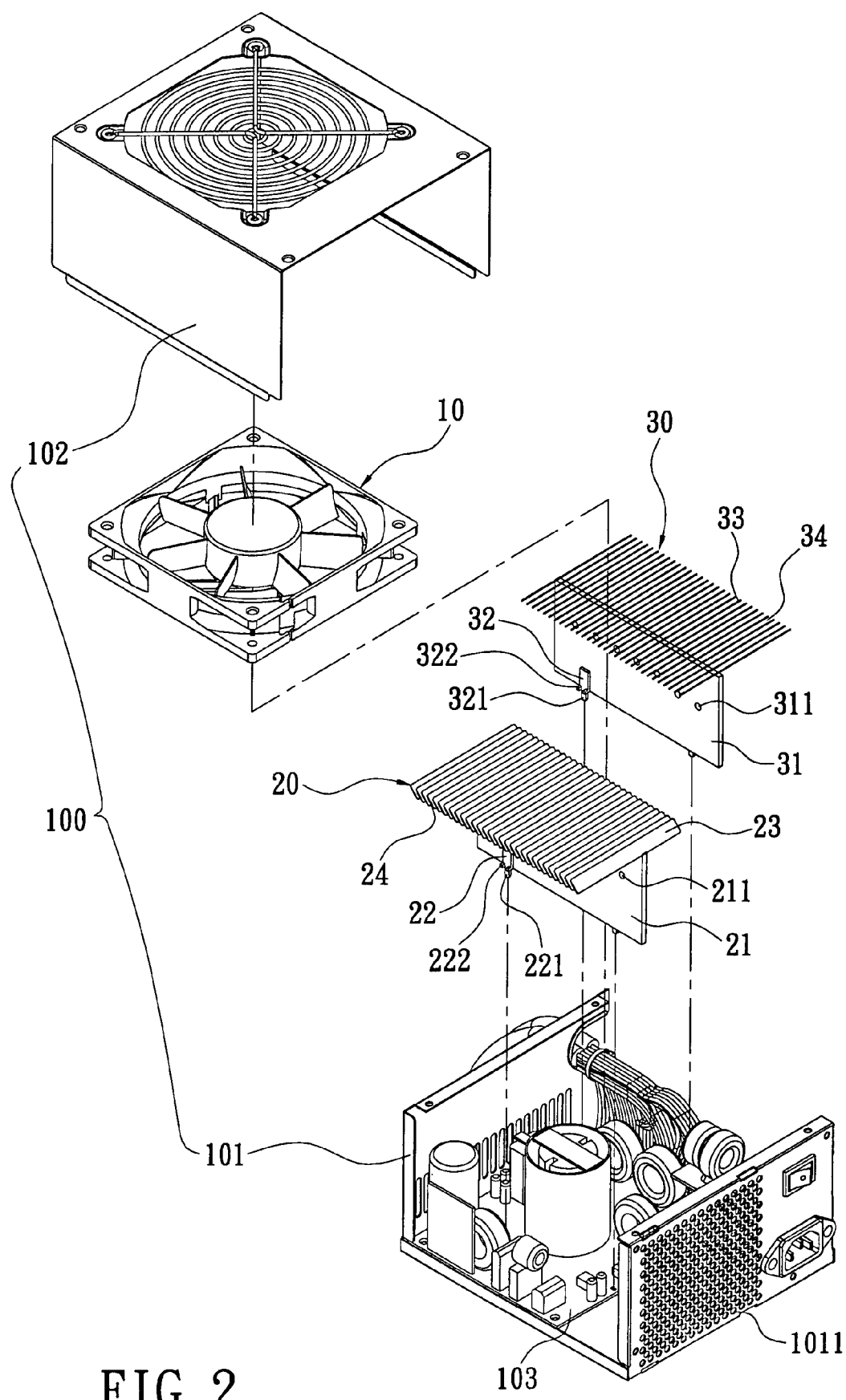
FIG. 2 is an exploded perspective view of the first embodiment of the present invention.
Figure 3:
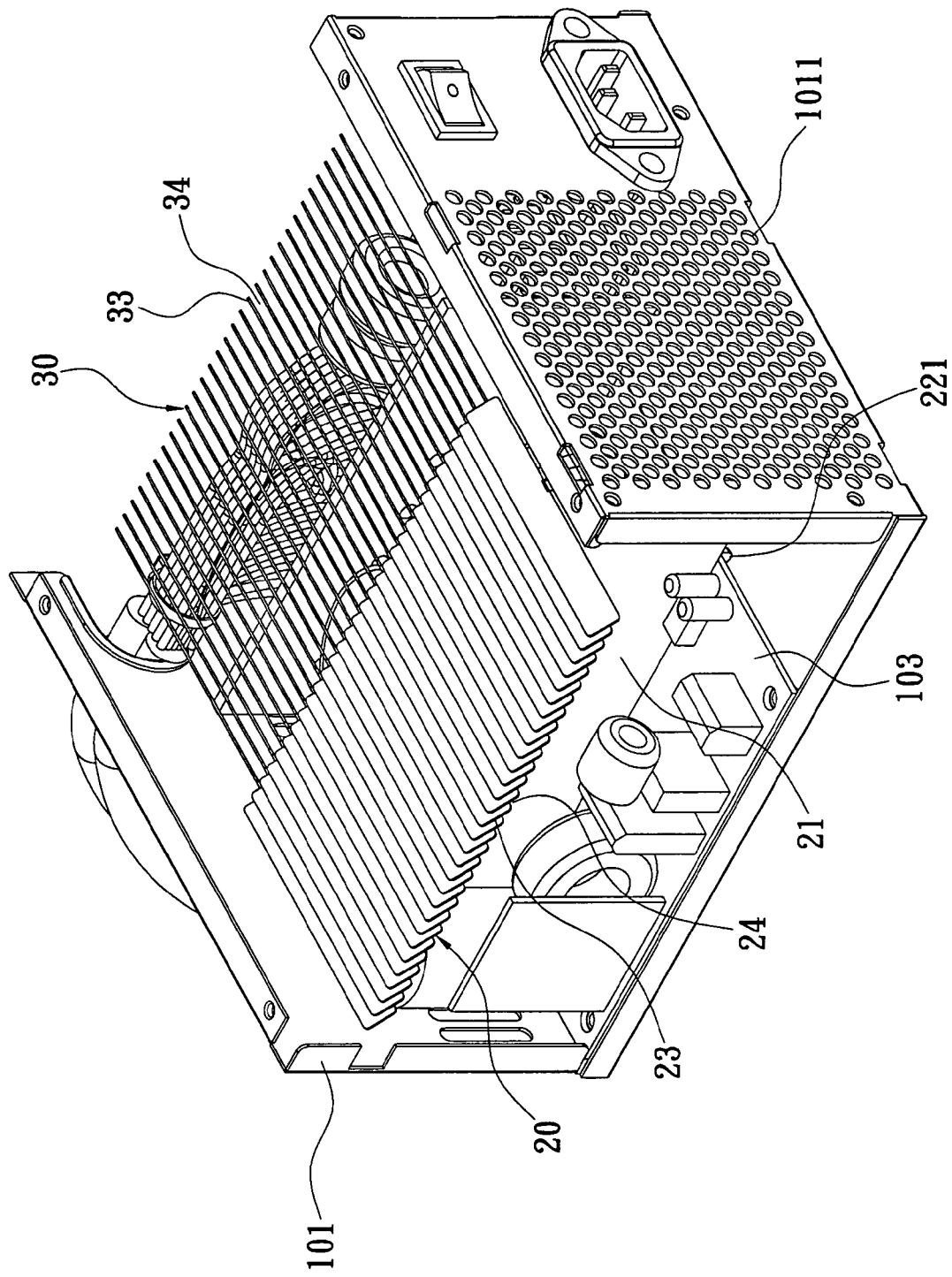
FIG. 3 is an assembly perspective view of part of the first embodiment of the present invention.
Figure 4:
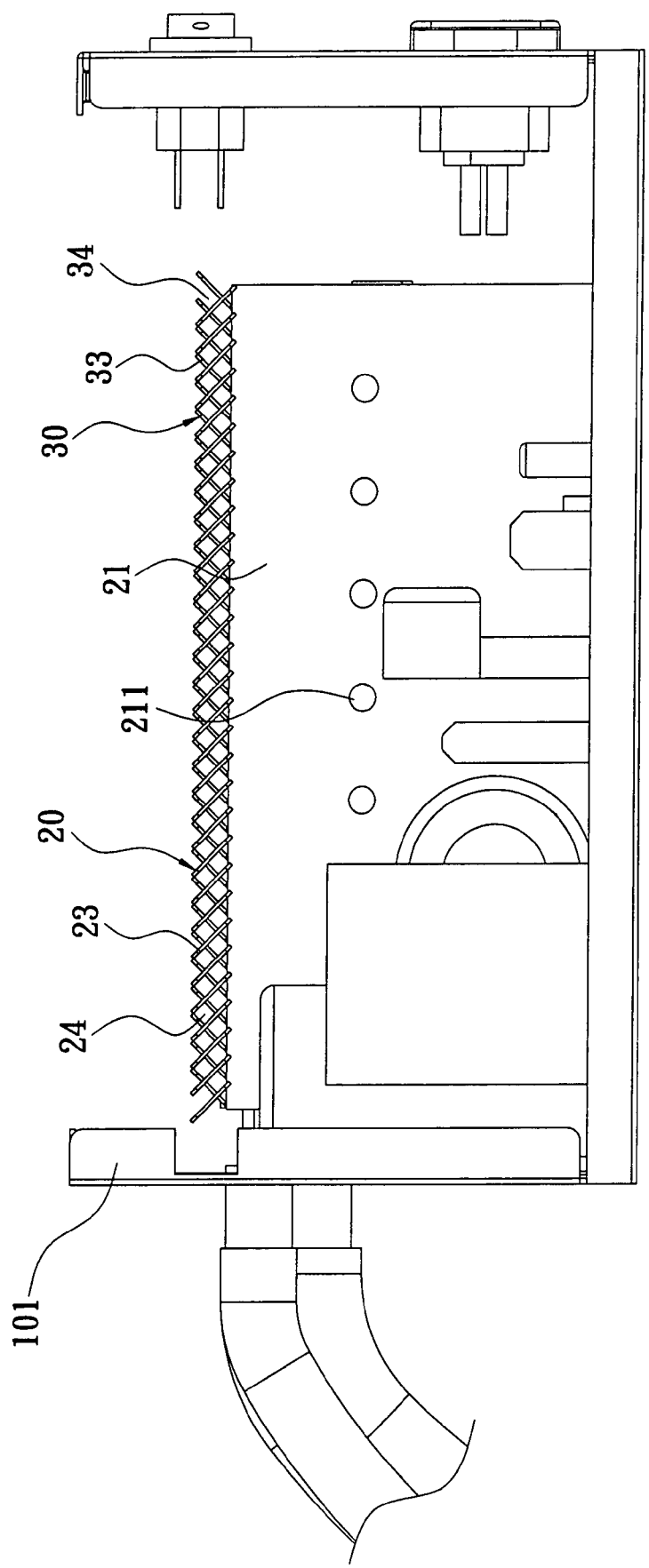
FIG. 4 is a side view of FIG. 3.

Reference is made to FIGS. 2~4, which show the cooling structure for a power supply of the first embodiment of the present invention. The cooling structure is installed in a housing 100 of the power supply. The housing 100 includes a base 101, and a cover 102 that covers the base 101. On the front side surface of the base 101, there is a plurality of cooling holes 1011. In the interior of the base 101, there is a circuit board 103. The cooling structure includes a cooling fan 10, a first cooler 20, and a second cooler 30. The cooling fan 10 is located on an inner side of a top surface of the cover 102 of the housing 100 for guiding air into the housing 100 to exhaust heat.

The first cooler 20 includes a first vertical board 21, two first branching legs 22, and a plurality of first cooling fins 23. The first vertical board 21 is made of conductive metal material and is a rectangular board. The first vertical board 21 has a plurality of fastening holes 211. The fastening holes 211 pass through the left side surface and the right side surface of the first vertical board 21. The first cooler 20 is located in the interior of the base 101 of the housing 100 that is adjacent to the left side and is below the cooling fan 10.

The first vertical board 21 is screwed with at least one chip (not shown in the figure) via the fastening holes 211 so that the first vertical board 21 contacts the chip for exhausting heat.

The two first branching legs 22 are formed by punching a metal flake. A plugging portion 221 extends downwards from the center of each of the two first branching legs 22. The plugging portion 221 is exposed to the bottom surface of the first vertical board 21. Two sides of the plugging portion 221 are each bent to form a connecting-pin portion 222. The plugging portion 221 is plugged into and fastened onto the circuit board 103. The two first branching legs 22 are respectively located on the bottom of the left side surface and the right side surface of the first vertical board 21 and separate from each other at a proper distance.

The first cooling fins 23 are made of heat-conductive metal materials. The first cooling fins 23 are disposed along the first vertical board 21 and transversely extend to the left side surface and the right side surface of the first vertical board 21. The first cooling fins 23 are attached to the top of the first vertical board 21 by a welding method or are integrated with the top of the first vertical board 21 into one piece. The first cooling fins 23 are slantingly disposed on the first vertical board 21 along a lengthwise direction of the first vertical board 21 and are separated from each other at intervals. The first cooling fins 23 slant in the same direction. There is a plurality of first air-guiding channels 24 between the first cooling fins 23. The slanting direction of the first air-guiding channels 24 corresponds to the cooling holes 1011.

The second cooler 30 includes a second vertical board 31, two second branching legs 32, and a plurality of second cooling fins 33. The second vertical board 31 has a plurality of fastening holes 311. The two second branching legs 32 have a plugging portion 321 and two connecting-pin portions 322 located on two sides of the plugging portion 321. The two second branching legs 32 are respectively located on the bottoms of the left side surface and the right side surface of the second vertical board 31 and separate from each other at a proper distance.

The second cooling fins 33 are slantingly disposed on the second vertical board 31 along the lengthwise direction of the second vertical board 31 and are separated from each other at intervals. The slanting direction of the second cooling fins 33 are opposite to the slanting direction of the first cooling fins 23 of the first cooler 20 (as shown in FIG. 4). There is a plurality of second air-guiding channels 34 between the second cooling fins 33. The second cooler 30 and the first cooler 20 are located below the cooling fan 10 in parallel, and is adjacent to the right side of the base 10 (as shown in FIG. 3).

When the cooling fan 10 is rotating, air is guided into the housing 100. The flowing direction of the airflow generated by the cooling fan 10 is slanting and downward in a spiral path. Therefore, the airflow that is adjacent to the left side of the base 101 passes through the first air-guiding channels 24 along the slanting first cooling fins 23, and is exhausted outside of the housing 100 via the cooling holes 1011 of the base 101. The airflow that is adjacent to the right side of the base 101 passes through the second air-guiding channels 34 along the slanting second cooling fins 33. Because the first cooing fins 23 and the second cooling fins 33 are slantingly disposed to fit in the airflow direction of the cooling fan 10, the airflow resisting force is reduced, and the noise generated by the cooling fan 10 is lowered. Furthermore, the electronic elements (not shown in the figure) on the circuit board 103 can be blown by the airflow from the cooling fan 10, and rapidly cooled.

Figure 5:
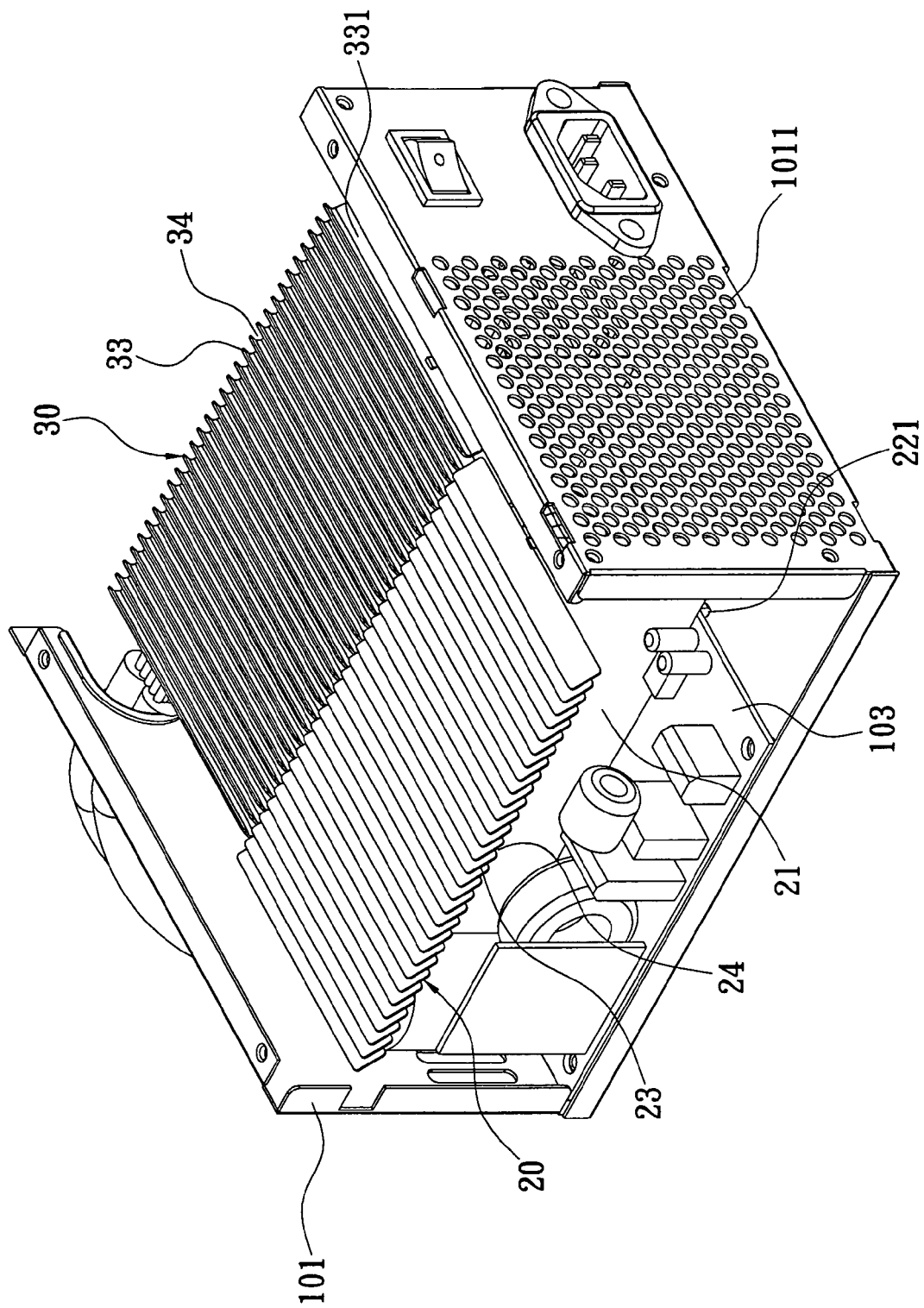
FIG. 5 is an assembly perspective view of part of the second embodiment of the present invention.
Figure 6:
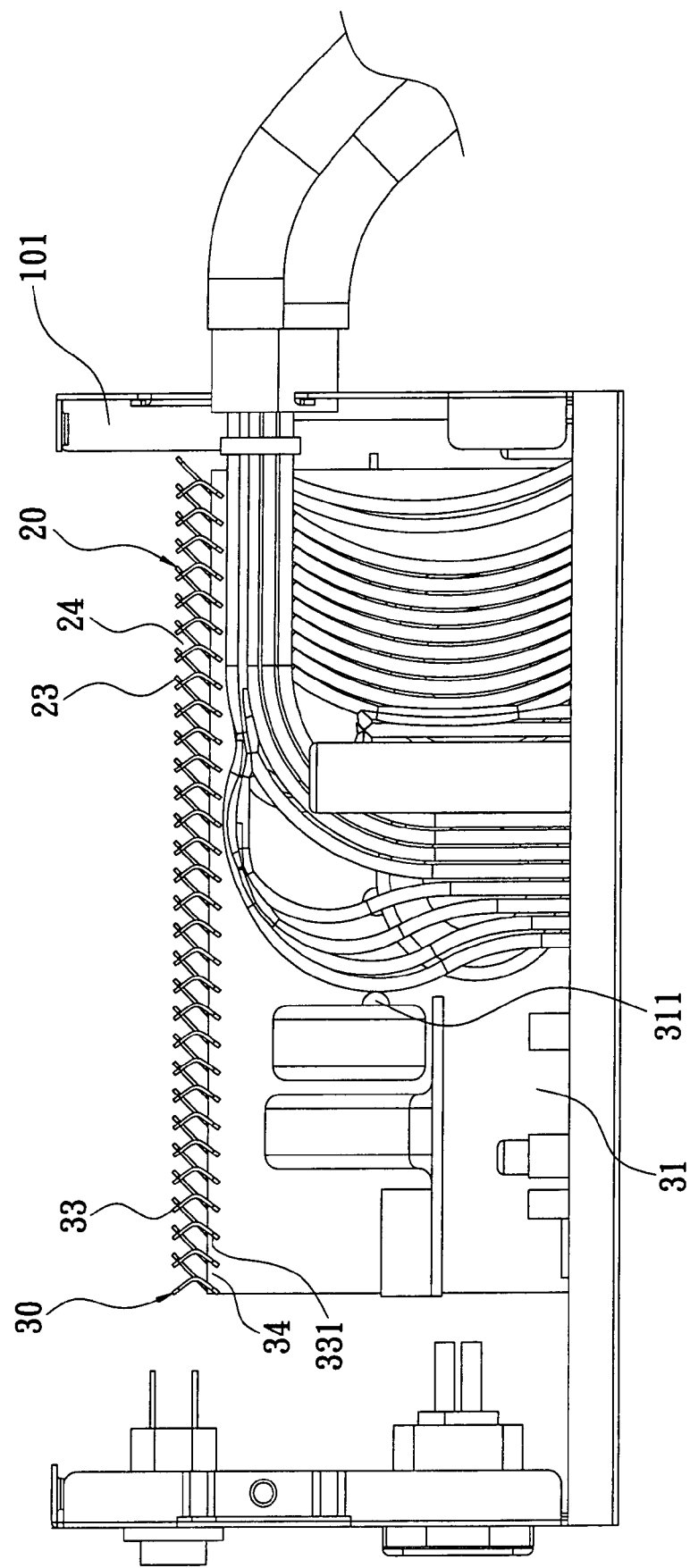
FIG. 6 is a side view of FIG. 5.

Reference is made to FIGS. 5 and 6, which show the second embodiment of the present invention. The difference between the second embodiment and the first embodiment is that the bottom of the second cooling fins 33 of the second cooler 30 extends along the cooling holes 1011 and is bent to form a guiding portion 331. Thereby, the airflow generated by the cooling fan 10 is guided forward to the cooling holes 1011 by the guiding portion 331 so that a great amount of heat is exhausted. The surface shape of the guiding portion 331 is not limited to a specified one. It can be flat (as shown in FIG. 6), or arced (not shown in the figure).

Figure 7:
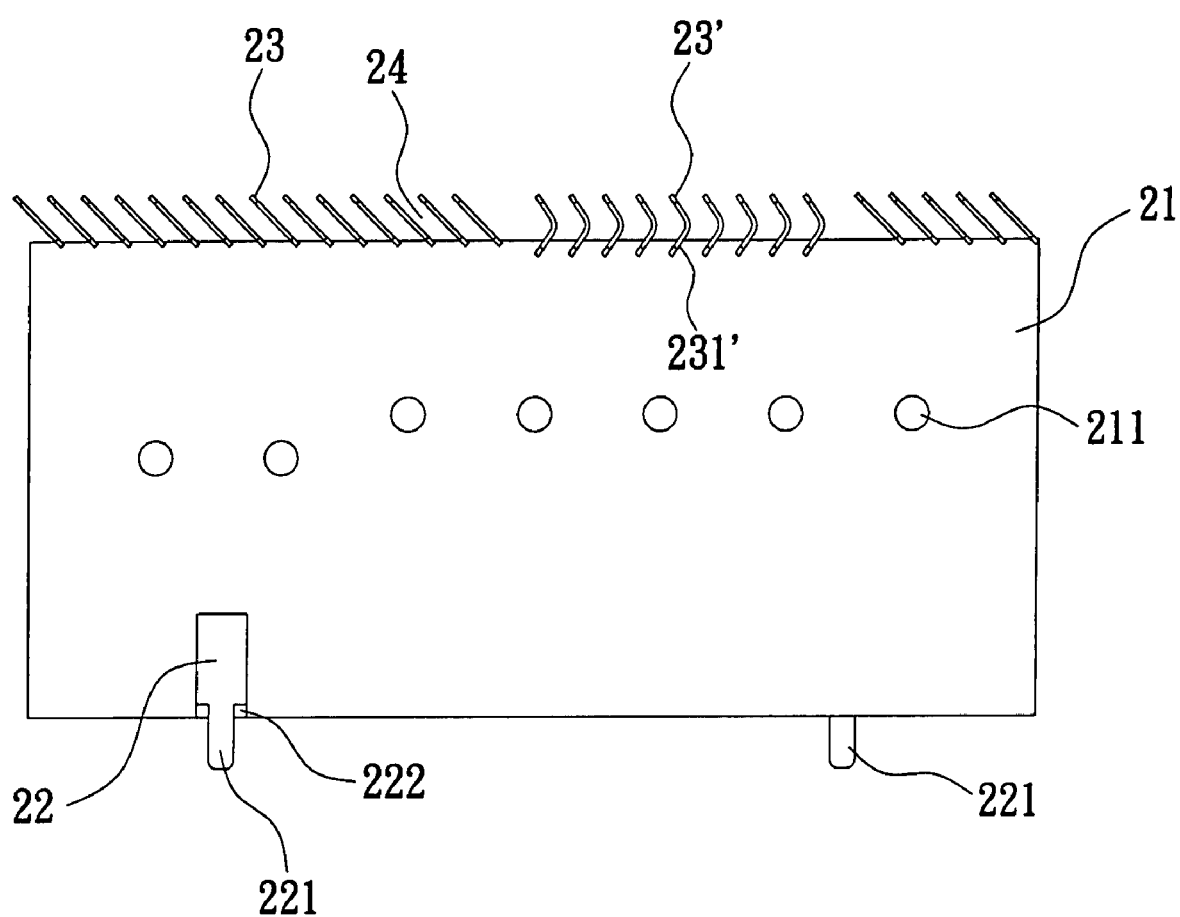
FIG. 7 is a side view of the first cooler of another embodiment of the present invention.

Reference is made to FIG. 7, which shows another embodiment of the first cooler 20. The slanting direction of part of the cooling fins 23' is different from the other cooling fins 23 in the first cooler 20. At a bottom of the cooling fins 23', there is a guiding portion 231' which guides the airflow generated from the cooling fan 10 to another direction. Thereby, it can exhaust more heat for the area that needs to exhaust a large amount of heat by guiding airflow to focus on that area. Similarly, this structure also can be applied to the second cooler 30.

The cooling structure of the present invention has a plurality of cooling fins 23, 33 that are slantingly disposed. There is a plurality of air-guiding channels 24, 34 between the cooling fins 23, 33. The air-guiding channels 24, 34 can guide the airflow generated from the cooling fan 10 forward to a specified direction. The hot air circulating flow will not occur in the housing 100. The electronic elements on the circuit board can be blown by the airflow from the cooling fan 10 to increase the total heat-conductive rate. The output power of the power supply increases, and the cooling fan 10 can be operated at a lower rotation speed to reduce noise.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. A cooling structure for a power supply having a housing, comprising:
    a cooling fan located on an inner side of a top surface of the housing;
    a first cooler located in an interior of the housing and located below the cooling fan, wherein the cooler includes a first vertical board and a plurality of first cooling fins, the first cooling fins being disposed slantwise on the first vertical board at intervals to define a plurality of first air-guiding channels between the first cooling fins; and
    a second cooler disposed in parallel with the first cooler, the second cooler including a second vertical board and a plurality of second cooling fins, the second cooling fins being disposed slantwise on the second vertical board at intervals to define a plurality of second air-guiding channels between the second cooling fins, the slanting direction of the second cooling fins of the second cooler being opposite to the slanting direction of the first cooling fins of the first cooler.

2. The cooling structure as claimed in claim 1, wherein the first vertical board comprises at least one branching leg, the branching leg extends to form a plugging portion, and the plugging portion extends outside of the bottom of the first vertical board.

3. The cooling structure as claimed in claim 1, wherein the first vertical board is a rectangular board, and the first cooling fins are disposed on the first vertical board along a lengthwise edge of the first vertical board.

4. The cooling structure as claimed in claim 1, wherein the first vertical board comprises at least one fastening hole, and the fastening hole passes through two side surfaces of the first vertical board.

5. The cooling structure as claimed in claim 1, wherein the first cooling fins are welded to the first vertical board or are integrated with the first vertical board into one piece.

6. The cooling structure as claimed in claim 1, wherein the first cooling fins all slant in the same direction.

7. The cooling structure as claimed in claim 1, wherein there is a plurality of cooling holes passing through one side of the housing, and a bottom of the second cooling fins of the second cooler extends forwards to the cooling holes and is bent to form a guiding portion.

* * * * *